United States Patent
Chan et al.

(10) Patent No.: US 8,877,659 B2
(45) Date of Patent: Nov. 4, 2014

(54) LOW-K DIELECTRIC DAMAGE REPAIR BY VAPOR-PHASE CHEMICAL EXPOSURE

(71) Applicants: Kelvin Chan, San Ramon, CA (US); Alexandros T. Demos, Fremont, CA (US)

(72) Inventors: Kelvin Chan, San Ramon, CA (US); Alexandros T. Demos, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 13/903,483

(22) Filed: May 28, 2013

(65) Prior Publication Data

US 2014/0004717 A1    Jan. 2, 2014

Related U.S. Application Data

(60) Provisional application No. 61/667,237, filed on Jul. 2, 2012.

(51) Int. Cl.
*H01L 21/00* (2006.01)
*H01L 21/263* (2006.01)
*H01L 21/3105* (2006.01)

(52) U.S. Cl.
CPC ........ *H01L 21/2636* (2013.01); *H01L 21/3105* (2013.01)
USPC ........................................................ 438/798

(58) Field of Classification Search
CPC .................................................. H01L 21/2636
See application file for complete search history.

(56) References Cited

U.S. PATENT DOCUMENTS

| | | | |
|---|---|---|---|
| 6,479,374 B1 | 11/2002 | Ioka et al. | |
| 6,518,205 B1 | 2/2003 | Wu et al. | |
| 7,241,704 B1 | 7/2007 | Wu et al. | |
| 8,216,861 B1 | 7/2012 | Yim et al. | |
| 2003/0054115 A1 | 3/2003 | Albano et al. | |
| 2005/0221606 A1* | 10/2005 | Lee et al. | 438/624 |
| 2006/0251827 A1 | 11/2006 | Nowak et al. | |
| 2010/0087062 A1 | 4/2010 | Lakshmanan et al. | |
| 2011/0117678 A1 | 5/2011 | Varadarajan et al. | |
| 2012/0258259 A1 | 10/2012 | Bansal et al. | |
| 2012/0270339 A1 | 10/2012 | Xie et al. | |

OTHER PUBLICATIONS

Kwak, S.-K.; Jeong, K.H.; Rhee, S.W. Nanocomposite low-k SiCOH films by direct PECVD using vinyltrimethylsilane. J. Electrochem. Soc. 2004, 151, F11-F16.*
International Search Report and Written Opinion dated Aug. 27, 2013 for PCT/US2013/042921.

* cited by examiner

*Primary Examiner* — Yasser A Abdelaziez
(74) *Attorney, Agent, or Firm* — Patterson & Sheridan, LLP

(57) ABSTRACT

A method for repairing and lowering the dielectric constant of low-k dielectric layers used in semiconductor fabrication is provided. In one implementation, a method of repairing a damaged low-k dielectric layer comprising exposing the porous low-k dielectric layer to a vinyl silane containing compound and optionally exposing the porous low-k dielectric layer to an ultraviolet (UV) cure process.

12 Claims, 10 Drawing Sheets

LOW-K DIELECTRIC DAMAGE REPAIR BY VAPOR-PHASE CHEMICAL EXPOSURE

CROSS-REFERENCE TO RELATED APPLICATIONS

This application claims benefit of U.S. provisional patent application Ser. No. 61/667,237, filed Jul. 2, 2012 which is herein incorporated by reference in its entirety.

BACKGROUND

1. Field

Implementations of the present invention generally relate to repairing and lowering the dielectric constant of low-k dielectric films used in semiconductor fabrication.

2. Description of the Related Art

The dielectric constant (k) of dielectric films in semiconductor fabrication is continually decreasing as device scaling continues. Minimizing integration damage on low dielectric constant (low-k) films is important to be able to continue decreasing feature sizes. However, as feature sizes shrink, improvement in the resistive capacitance and reliability of dielectric films becomes a serious challenge.

Porous low-k dielectric films including for example, carbon-doped oxides (CDO), experience damage to their bonding structures when exposed to integration steps such as, but not limited to, chemical mechanical polishing (CMP) or planarization, etching, ashing, and cleaning. In particular, Si—H and Si—OH bonding increases in concentration after one or more of these integration steps. This increase in Si—H and Si—OH may lead to an increase in k-value. Present repair techniques involve liquid phase silylation or use of supercritical $CO_2$. However, such techniques have not proven effective for repairing sidewall damage of recessed features in the films.

Thus, a method for repairing the dielectric films to lower the k-value is necessary to improve efficiency and allow for smaller device sizes.

SUMMARY

Implementations of the present invention generally relate to repairing and lowering the dielectric constant of low-k dielectric layers used in semiconductor fabrication. In one implementation, a method of repairing a damaged low-k dielectric layer comprising exposing the porous low-k dielectric layer to a vinyl silane containing compound and optionally exposing the porous low-k dielectric layer to an ultraviolet (UV) cure process.

In another implementation, a method of repairing a damaged low-k dielectric layer is provided. The method comprises exposing the porous low-k dielectric layer to an oxidizing compound, exposing the porous low-k dielectric layer to a silylation agent, and optionally exposing the porous low-k dielectric layer to an ultraviolet (UV) cure process.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

Figure 1A:
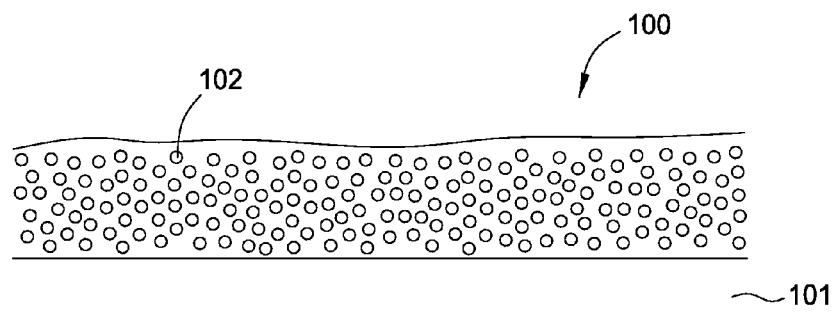
FIGS. 1A-1F illustrate a dielectric layer during various stages of processing according to implementations described herein.

To facilitate understanding, identical reference numerals have been used, wherever possible, to designate identical elements that are common to the figures. It is contemplated that elements and/or process steps of one implementation may be beneficially incorporated in other implementations without additional recitation.

DETAILED DESCRIPTION

Implementations of the present invention generally relate to repairing and lowering the dielectric constant of low-k films used in semiconductor fabrication. Porous low-k dielectric films including, for example, carbon-doped oxides (CDO) experience damage to their bonding structures when exposed to integration steps such as, but not limited to, chemical mechanical polishing (CMP) or planarization, etching, ashing, and cleaning. In particular, Si—H and Si—OH bonding increases in concentration after one or more of these integration steps. Implementations of the invention include methods for reducing the concentration of Si—H and Si—OH bonding by incorporating direct and indirect post-damage repair processes. Implementations of the invention also include hybrid processes to repair both Si—H and Si—OH damage.

FIG. 1A illustrates a dielectric film 100 deposited onto a structure 101. The structure 101 may be a substrate, such as, for example, a silicon wafer, or a previously formed layer, such as, for example, a metallization or interconnect layer. The low-k dielectric film 100 may be any conventional porous, low-k, silicon-based dielectric material having a k value of about three or less. Exemplary low-k dielectric films include, for example, $SiO_2$, SiOC, SiON, SiCOH, SiOCN, and other related films. In one implementation, the low-k dielectric material is an organosilicate glass (OSG, also known as SiCOH) which is a silicon oxide containing carbon and hydrogen atoms. SiCOH may have a k-value between about two and three and is available as Black Diamond II™ from Applied Materials of Santa Clara, Calif. The low-k dielectric film 100 may have pores 102 formed therein. The pores may be nanopores. The nanopores may have a diameter in the range from about 0.5 nm to about 20 nm. The low-k dielectric layer may be deposited by a plasma-enhanced chemical vapor deposition (PECVD) process or any other suitable deposition technique. The low-k dielectric film 100 may be a porous carbon doped oxide (CDO) film. The low-k dielectric film 100 may have a k-value greater than the k-value of the dielectric film after processing of the film.

Figure 1B:
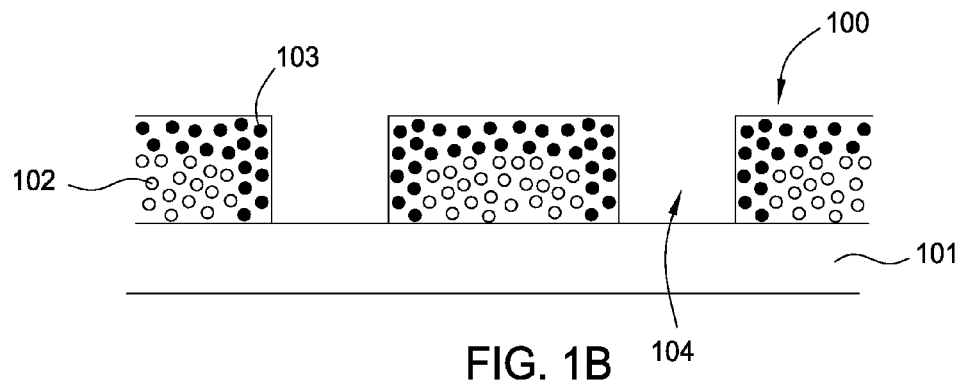

FIG. 1B illustrates the low-k dielectric film 100 after being planarized and etched to form features 104 into the low-k dielectric film 100. The low-k dielectric film 100 may be planarized by a CMP process, for example. The low-k dielectric film 100 may be etched by masking a portion of the low-k dielectric film 100, contacting the unmasked portion of the low-k dielectric film 100 with a plasma formed from hydrofluoric acid (HF) vapor, and ashing away the mask using a plasma formed from oxygen ($O_2$) gas or $CO_2$ gas, for example. The k-value of the low-k dielectric film 100 may be repaired after any of the processing steps using the implementations described herein.

The planarization, ashing, and etching of the dielectric film 100 introduce hydrogen and/or water into the dielectric film 100 causing Si—H and/or Si—OH groups to form, for example, which make the dielectric film 100 hydrophilic. The hydrophilic property of the dielectric film 100 causes the pores 102 to fill with water creating damaged pores 103. The Si—OH groups and damaged pores 103 increase the k-value of the dielectric film 100. The Si—H groups lead to the degradation of electrical properties (e.g., leakage and time dependent dielectric breakdown (TDDB)). The damage from the planarization and etching are usually localized to an upper portion of the dielectric film 100 and to the sidewalls of the features 104, as shown in FIG. 1B.

Figure 1C:
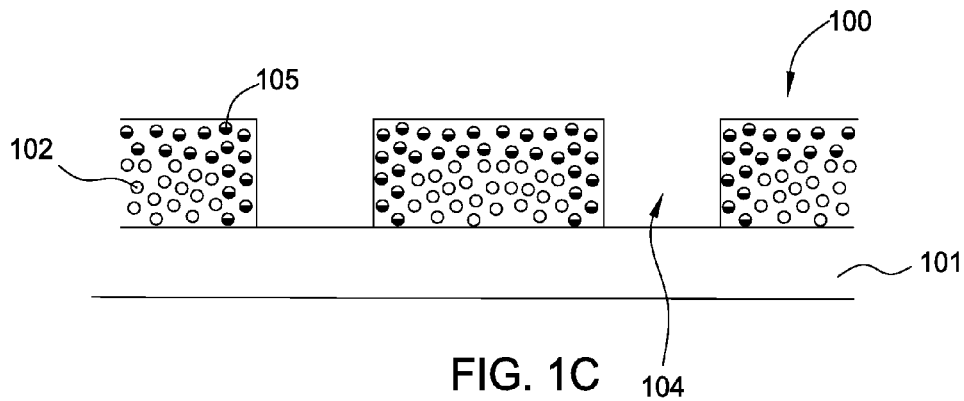

FIG. 1C illustrates the low-k dielectric film 100 after being repaired by one or more processes which are described below. The repair processes decrease the k-value of the low-k dielectric film 100 by removing the water from the damaged pores 103, thereby creating repaired pores 105, and by converting the Si—H groups into Si—$CH_2$—$CH_2$—Si($CH_3$)$_3$ and the Si—OH groups in the low-k dielectric film 100 into hydrophobic Si—O—Si($CH_3$)$_3$ groups, for example. The hydrophobic groups assist in driving water out of the damaged pores 103 of the low-k dielectric film 100.

Figure 1D:
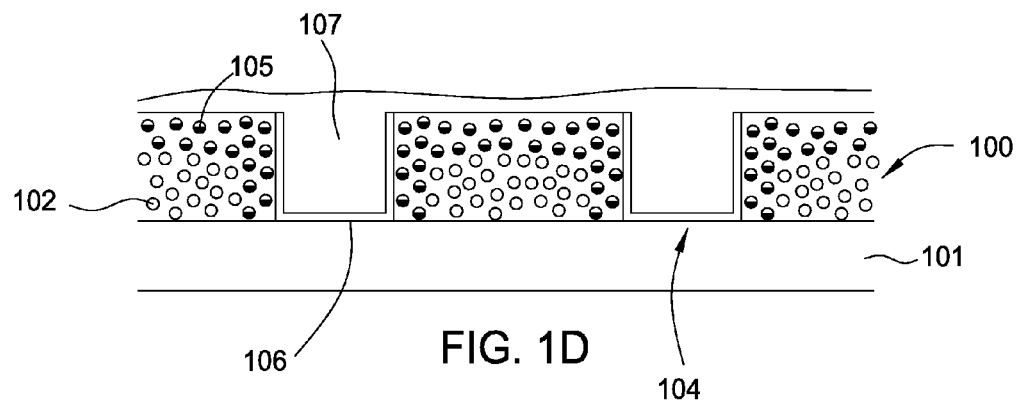
Figure 1E:
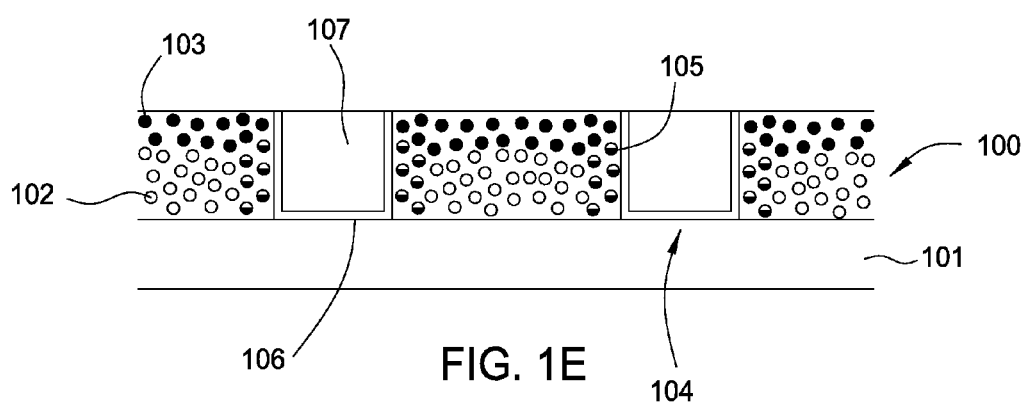
Figure 1F:
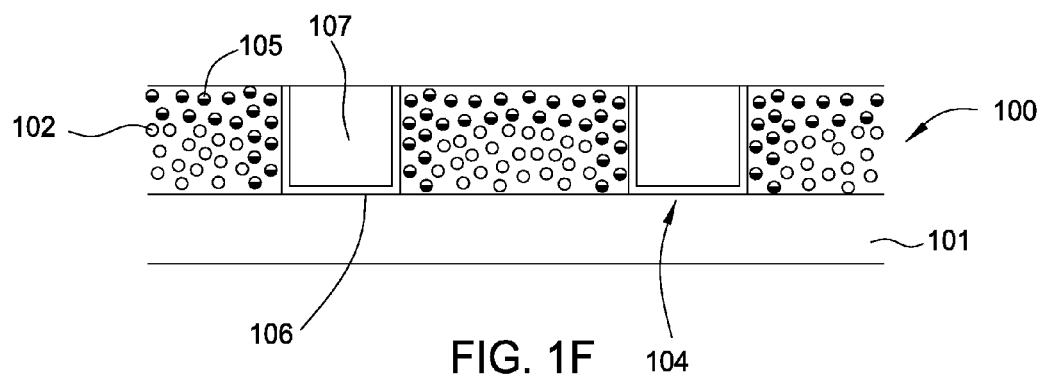

After the low-k dielectric film 100 has been repaired, subsequent processes may be performed to continue the fabrication of the semiconductor. For example, a diffusion barrier 106 may be deposited into the features 104 of the dielectric film 100 and a metal material 107, such as, for example, copper or a copper alloy, may be deposited into the features 104, as seen in FIG. 1D. It may be necessary to planarize the metal material 107 and remove any oxides from the metal material 107 that may form during planarization. Common metal oxide removal techniques involve the use of hydrogen or ammonia plasmas. The planarization and/or metal oxide removal processes may re-damage the surface of the low-k dielectric film 100, as seen in FIG. 1E. The low-k dielectric film 100 may be repaired using any of the repair processes described herein, as seen in FIG. 1F.

Figure 2:
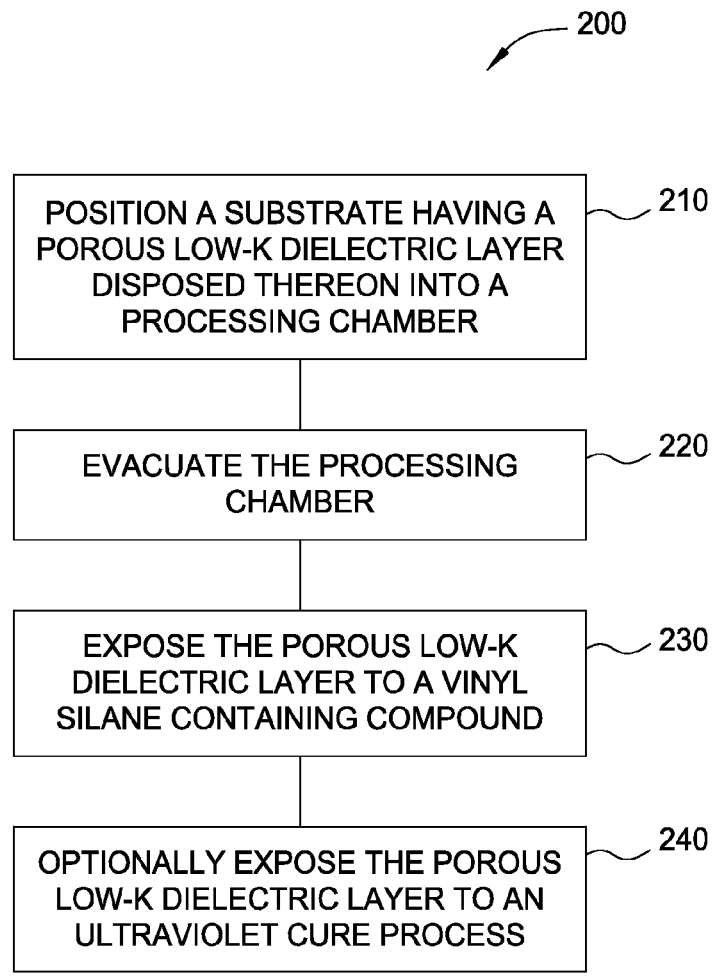
FIG. 2 is a process flow diagram illustrating one method of repairing a damaged film according to implementations described herein.

FIG. 2 is a process flow diagram illustrating one method 200 of repairing a damaged film according to implementations described herein. At block 210, a substrate having a porous low-k dielectric layer disposed thereon is positioned in a processing chamber. The substrate and low-k dielectric film may be similar to the low-k dielectric film 100 and structure 101 depicted in FIGS. 1A-1F. The processing chamber may be similar to the processing chamber 900 depicted in FIG. 9. At block 220, the processing chamber may be evacuated. The processing chamber may be evacuated by use of a vacuum pump.

At block 230, the low-k dielectric layer is exposed to a vinyl silane containing compound. The vinyl silane may be in liquid or vapor form. In a vapor phase process the dielectric film 100 is contacted with a vaporized vinyl silane containing compound. Vaporizing the vinyl silane containing compound allows the vinyl silane containing compound to penetrate deeply into the low-k dielectric film 100. Exemplary vinyl silane containing compounds may be of the formula:

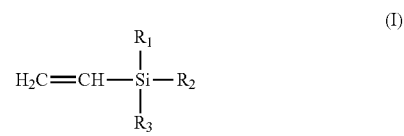

(I)

wherein $R_1$, $R_2$, and $R_3$ are each individually selected from hydrogen (H), alkyl groups (e.g., methyl, ethyl, propyl, butyl, etc), alkoxy groups (e.g., methoxy, ethoxy, propoxy etc.), chlorine, and vinyl groups. Other substituted vinyl silanes also fall within the implementations described herein. Other unsaturated compounds know to react with Si—H including olefins, acetyl acetone, vinyl acetate, styrene may also be used with certain implementations described herein.

Exemplary vinyl silanes include vinyl silane, trimethylvinylsilane (TMVS), vinyltrichlorosilane, vinyltrimethoxysilane, vinyltriethoxysilane, vinyltris(2-methoxyethoxy)silane, vinyltrisisopropoxysilane, vinyltris(tert-butylperoxy)silane, vinyldimethylchlorosilane, vinyldimethylethoxysilane, vinylmethyldichlorosilane, vinylmethyldimethoxysilane, vinylmethyldiethoxysilane, methylvinyldi(n-methylacetylamido)silane, methylvinyldi(5-caprolactam)silane, bis(methyldichlorosilyl)ethane, and combinations thereof. In one implementation, the vinyl silane containing compound is trimethylvinylsilane (TMVS).

The vinyl silane containing compound vaporization process may be conducted by placing the low-k dielectric film 100 into a processing chamber, vaporizing the vinyl silane containing compound, and flowing the vaporized vinyl silane containing compound into the processing chamber. The vinyl silane containing compound may alternatively be vaporized in the processing chamber. The vinyl silane containing compound may be introduced into the processing chamber through a showerhead positioned at an upper portion of the processing chamber. A carrier gas, such as He, Ar, $N_2$, and combinations thereof may be used to assist the flow of the vinyl silane containing compound into the processing chamber. Additionally, a catalyst, such as water, may be added during the vinyl silane containing compound vapor phase process.

The vinyl silane containing compound vapor phase process may be conducted at a processing chamber pressure between 50 mTorr and 500 Torr, for example, from about 200 mTorr to about 6 Torr. During the silylation process, the dielectric film may be heated to a temperature from about 100° C. to about 400° C., for example, from about 200° C. to about 390° C. The flow rate of the vinyl silane containing compound may be between 1 sccm and 10,000 sccm, for example, from about 400 sccm to about 2,000 sccm. The flow rate of the optional carrier gas may be between 1 sccm and 10,000 sccm, for example, from about 2,000 sccm to about 3,000 sccm. The processing time may be between 1 min and 10 min, such as 3 min. The pressure within the processing chamber may be varied during the vapor phase process. For example, the pressure may be varied between 50 Torr and 500 Torr.

At block 240, the porous low-k dielectric layer is optionally exposed to an ultraviolet (UV) cure process to repair the low-k dielectric film 100. The UV cure process of block 240 may be performed prior to the process of block 230, simultaneously with the process of block 230, subsequent to the process of block 230, or any combinations of the aforementioned sequences. The UV cure process comprises contacting the low-k dielectric film 100 with UV radiation to remove Si—H from the dielectric film and/or water from the damaged pores and to create the Si—CH$_2$—CH$_2$—Si(CH$_3$)$_3$ and/or the Si—O—Si(CH$_3$)$_3$ groups in the low-k dielectric film 100 described above. The UV cure process may be conducted by placing the low-k dielectric film 100 into a processing chamber and engaging a source of UV radiation to contact the low-k dielectric film 100 with UV radiation. The UV radiation source may be a UV lamp, for example. The UV radiation source may be positioned outside of the processing chamber, and the processing chamber may have a quartz window through which UV radiation may pass. The low-k dielectric film 100 may be positioned in an inert gas environment, such as He or Ar, for example. The processing chamber may also include a microwave source to heat the low-k dielectric film 100 prior to or concurrently with contacting the low-k dielectric film 100 with UV radiation. The UV cure process may also be conducted using a plasma to simulate UV radiation wavelengths. The plasma may be formed by coupling RF power to a treatment gas such as He, Ar, O$_2$, and N$_2$. The plasma may be formed by a remote plasma source (RPS) and delivered to the processing chamber.

The UV cure process may be conducted at a processing chamber pressure between 1 Torr and 100 Torr, such as 6 Torr, a dielectric film temperature between 20° C. and 400° C., such as 385° C., an environment gas flow rate between 8,000 sccm and 24,000 sccm, such as 16,000 sccm, a treatment gas flow rate between 2,000 sccm and 20,000 sccm, such as 12,000 sccm, a RF power between 50 W and 1,000 W, such as 500 W, a RF power frequency of 13.56 MHz, a processing time between 10 sec and 180 sec, such as 60 sec, a UV irradiance power between 100 W/m$^2$ and 2,000 W/m$^2$, such as 1,500 W/m$^2$, and UV wavelengths between 100 nm and 400 nm. The UV cure process described above advantageously repairs the damaged pores 103 in the sidewalls of the features 104.

In one implementation, the UV cure temperature may be from 100° C. to about 800° C., for example about 400° C. The UV cure time may be from about 10 seconds to about 600 seconds. A UV cure gas may be flown to the processing chamber through the UV transparent gas distribution showerhead. In one implementation, an inert cure gas, such as helium and argon, may be flown to the processing chamber at a flow rate between about 1,000 sccm to about 27,000 sccm.

In another implementation, exposure to the vinyl silane containing compound in block 230 and UV curing in block 240 can be performed simultaneously. In such a case, the UV unit turns on/off at the same time with the introduction of the vinyl silane containing compound. In another implementation, the UV cure in block 240 may be performed before exposure to the vinyl silane containing compound in block 230. In yet another implementation, exposure to the vinyl silane containing compound in block 230 and the UV cure in block 240 can be performed alternately. For example, the UV cure may be performed to remove some water from surface/side wall. Exposure to the vinyl silane containing compound is then performed to recover surface hydrophobicity. The UV cure is then performed to further recover low-k film damage.

In such a case, exposure to the vinyl silane containing compound and the UV cure may be performed for about 15 to about 30 seconds, respectively. It is contemplated that the vinyl silane containing compound flow rate, time, UV power, substrate temperature, chamber pressure of the processing chambers may vary depending upon the application. If desired, the UV curing may be performed in a separate processing chamber different than the processing chamber for exposure to the vinyl silane containing compound.

Figure 3:
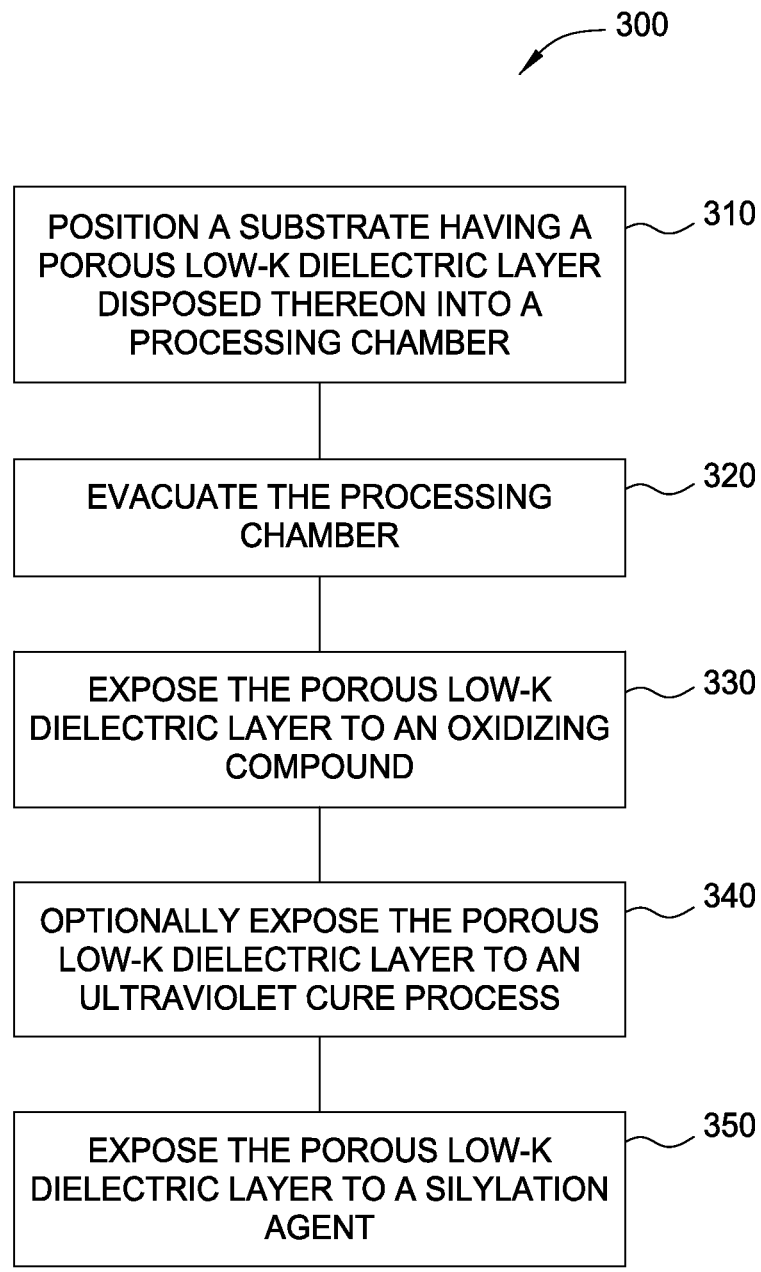
FIG. 3 is a process flow diagram illustrating another method of repairing a damaged film according to implementations described herein.

FIG. 3 is a process flow diagram illustrating another method 300 of repairing a damaged film according to implementations described herein. At block 310, a substrate having a porous low-k dielectric layer disposed thereon is positioned in a processing chamber. The substrate and low-k dielectric film may be similar to the low-k dielectric film 100 and structure 101 depicted in FIGS. 1A-1F. The processing chamber may be similar to the processing chamber 900 depicted in FIG. 9. At block 320, the processing chamber may be evacuated. The processing chamber may be evacuated by use of a vacuum pump.

At block 330, the porous low-k dielectric layer is exposed to an oxidizing compound. The oxidizing compound may be in liquid or vapor form. Exemplary oxidizing compounds include oxygen (O$_2$), oxygen-containing compounds (e.g., N$_2$O, NO), ozone (O$_3$), ozone-containing compounds, peroxide (H$_2$O$_2$), peroxide containing compounds, and combinations thereof. Exposure to the oxidizing compound may be conducted by placing the dielectric film 100 into a processing chamber and flowing either liquid or vapor of the oxidizing compound into the processing chamber. The oxidizing compound may alternatively be vaporized in the processing chamber. The oxidizing compound may be introduced into the processing chamber through a showerhead positioned at an upper portion of the processing chamber. A carrier gas, such as He, Ar, N$_2$, H$_2$, and combinations thereof may be used to assist the flow of the oxidizing compound into the processing chamber.

Exposure to the oxidizing compound may be conducted at a processing chamber pressure between 50 mTorr and 500 Torr, for example, from about 200 mTorr to about 6 Torr. During the oxidation process, the dielectric film may be heated to a temperature from about 100° C. to about 400° C., for example, from about 200° C. to about 390° C. The flow rate of the oxidizing compound may be between 1 sccm and 10,000 sccm, for example, from about 400 sccm to about 2,000 sccm. The flow rate of the optional carrier gas may be between 1 sccm and 10,000 sccm, for example, from about 2,000 sccm to about 3,000 sccm. The processing time may be between one minute and ten minutes, such as three minutes. The pressure within the processing chamber may be varied during the vapor phase process. For example, the pressure may be varied between 50 Torr and 500 Torr.

At block 340, the porous low-k dielectric layer is optionally exposed to an ultraviolet (UV) cure process to repair the low-k dielectric film 100. The UV cure process of block 340 may be performed prior to the process of block 330, simultaneously with the process of block 330, subsequent to the process of block 330, or any combinations of the aforementioned sequences. The process conditions for the UV cure process of block 340 may the same as or similar to the process conditions of the UV cure process of block 240.

At block 350, the porous low-k dielectric layer is exposed to a silylation agent. Exposure of the porous low-k dielectric layer 100 to the silylation agent converts the Si—OH groups in the dielectric film 100 into hydrophobic Si—O—Si(CH$_3$)$_3$ groups, for example. The hydrophobic Si—O—Si(CH$_3$)$_3$ groups assist in driving water out of the damaged pores 103 of the low-k dielectric film 100.

Exposure of the low-k dielectric layer 100 to the silylation agent may occur in vapor phase or liquid phase. The vapor phase silylation process comprises contacting the dielectric film 100 with a vaporized silylation agent to create the Si—O—Si(CH$_3$)$_3$ groups in the low-k dielectric film 100 described above. Vaporizing the silylation agent allows the silylation agent to penetrate deeply into the dielectric film 100. Exemplary silylation agents include hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS) (CH$_3$—O—Si—(CH$_3$)$_3$), dimethyldimethoxysilane (DMDMS) ((CH$_3$)$_2$—Si—(OCH$_3$)$_2$), methyltrimethoxysilane (MTMS) ((CH$_3$—O—)$_3$—Si—CH$_3$), phenyltrimethoxysilane (PTMOS) (C$_6$H$_5$—Si—(OCH$_3$)$_3$), phenyldimethylchlorosilane (PDMCS) (C$_6$H$_5$—Si(Cl)—(CH$_3$)$_2$), dimethylaminotrimethylsilane (DMATMS) ((CH$_3$)$_2$—N—Si—(CH$_3$)$_3$), bis(dimethylamino)dimethylsilane (BDMADMS), or other compounds containing Si, H, and C.

The vapor phase silylation process may be conducted by placing the low-k dielectric film 100 into a processing chamber, vaporizing the silylation agent, and flowing the vaporized silylation agent into the processing chamber. The silylation agent may alternatively be vaporized in the processing chamber. The silylation agent may be introduced into the processing chamber through a showerhead positioned at an upper portion of the processing chamber. A carrier gas, such as He, Ar, N$_2$, and combinations thereof, may be used to assist the flow of the silylation agent into the processing chamber. Additionally, a catalyst, such as water, may be added during the vapor phase silylation process.

The vapor phase silylation process may be conducted at a processing chamber pressure between 50 mTorr and 500 Torr, for example, from about 200 mTorr to about 6 Torr. During the oxidation process, the dielectric film may be heated to a temperature from about 100° C. to about 400° C., for example, from about 200° C. to about 390° C. The flow rate of the silylation agent may be between 1 sccm and 10,000 sccm, for example, from about 400 sccm to about 2,000 sccm. The flow rate of the optional carrier gas may be between 1 sccm and 10,000 sccm, for example, from about 2,000 sccm to about 3,000 sccm. The processing time may be between one minute and ten minutes, such as three minutes. The pressure within the processing chamber may be varied during the vapor phase process. For example, the pressure may be varied between 50 Torr and 500 Torr.

The porous low-k dielectric layer is optionally exposed to an ultraviolet (UV) cure process to repair the low-k dielectric film 100. The UV cure process of block may be performed prior to the process of block 350, simultaneously with the process of block 350, subsequent to the process of block 350, or any combinations of the aforementioned sequences. The process conditions for the UV cure process may be the same as or similar to the process conditions of the UV cure process of block 240.

Various purge gas and evacuation processes may be performed during method 300. For example, it may be advantageous flow a purge gas into the chamber and/or evacuate the chamber after exposing the porous low-k dielectric layer to an oxidizing compound and prior to exposing the low-k dielectric layer to a silylation agent. In certain implementations where a carrier gas is used during block 230, the carrier gas may be used as a purge gas by continuing to flow the carrier gas after flow of the oxidizing compound has ceased. The processing chamber may be evacuated by use of vacuum pump.

Figure 4:
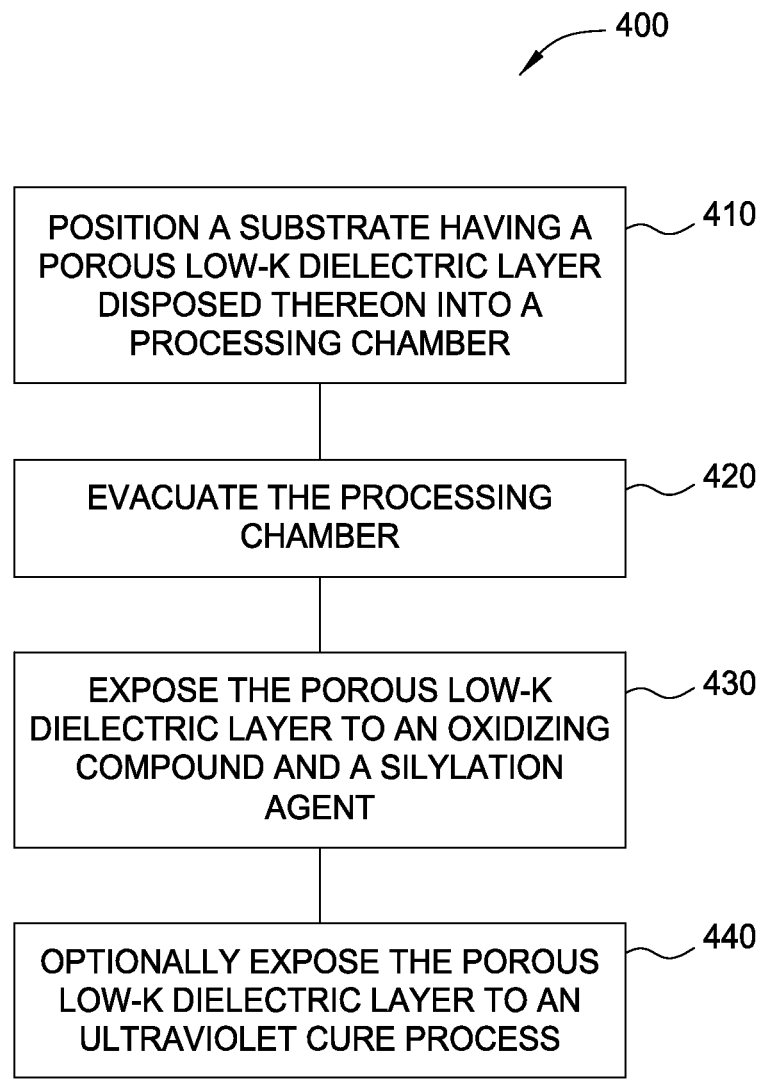
FIG. 4 is a process flow diagram illustrating another method of repairing a damaged film according to implementations described herein.

FIG. 4 is a process flow diagram illustrating another method 400 of repairing a damaged film according to implementations described herein. The method 400 is similar to the method 300 except that exposing the porous low-k dielectric layer to an oxidizing compound and a silylation agent occur simultaneously rather than as separate step. At block 410, a substrate having a porous low-k dielectric layer disposed thereon is positioned in a processing chamber. At block 420, the processing chamber may be evacuated. At block 430, the porous low-k dielectric layer is simultaneously exposed to an oxidizing compound and a silylation agent. The oxidizing compound and silylation agent may be in liquid or vapor form. The oxidizing compound and silylation agent may mixed prior to being supplied to the chamber or may enter the processing chamber separately and mix inside the processing chamber. A carrier gas, such as He, Ar, N$_2$, and combinations thereof, may be used to assist the flow of the silylation agent into the processing chamber. The processing conditions may be the same as or similar to the processing conditions previously described for methods 200 and 300.

At block 440, the porous low-k dielectric layer is optionally exposed to an ultraviolet (UV) cure process to repair the low-k dielectric film 100. The UV cure process of block 440 may be performed prior to the process of block 430, simultaneously with the process of block 430, subsequent to the process of block 430, or any combinations of the aforementioned sequences. The process conditions for the UV cure process of block 440 may the same as or similar to the process conditions of the UV cure process of block 240.

Figure 5:
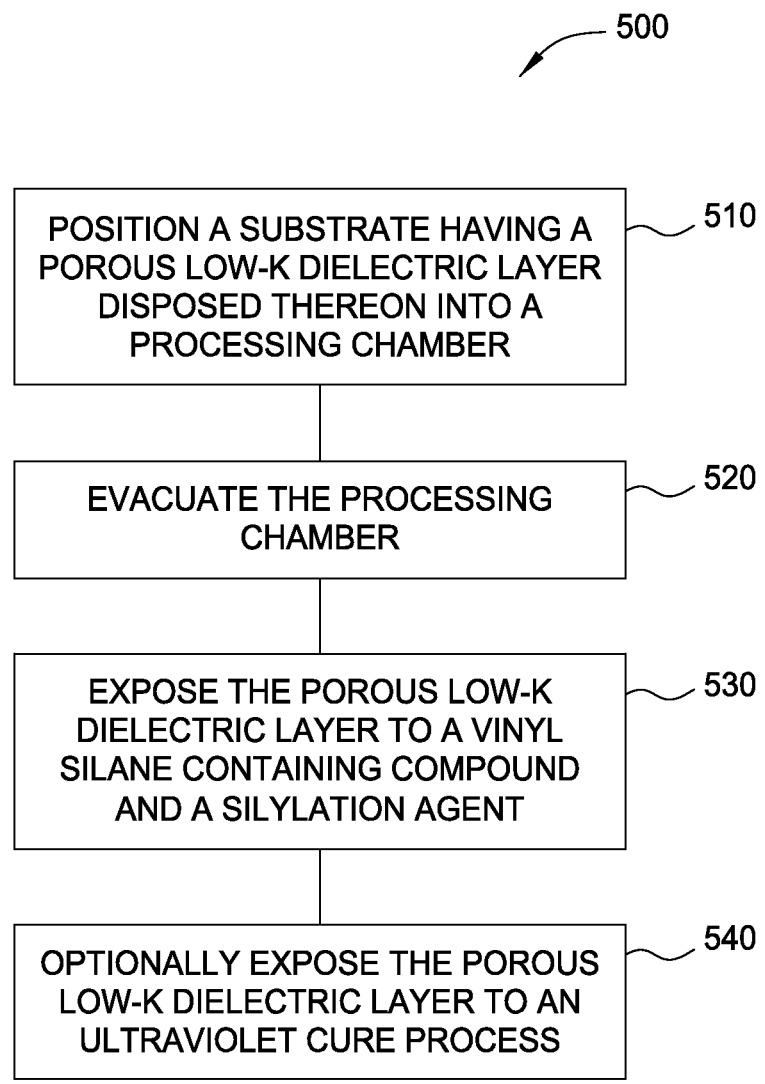
FIG. 5 is a process flow diagram illustrating another method of repairing a damaged film according to implementations described herein.

FIG. 5 is a process flow diagram illustrating another method 500 of repairing a damaged film according to implementations described herein. The method 500 is similar to the method 200 except that the porous low-k dielectric layer is exposed to both a vinyl silane containing compound and a silylation agent. Exposure to the vinyl silane containing compound and the silylation agent may occur simultaneously. At block 510, a substrate having a porous low-k dielectric layer disposed thereon is positioned in a processing chamber. At block 520, the processing chamber may be evacuated. At block 530, the porous low-k dielectric layer is simultaneously exposed to a vinyl silane containing compound and a silylation agent. The vinyl silane containing compound and silylation agent may be in liquid or vapor form. The vinyl silane containing compound and silylation agent may be mixed prior to being supplied to the chamber or may enter the processing chamber separately and mix inside the processing chamber. A carrier gas, such as He, Ar, N$_2$, and combinations thereof, may be used to assist the flow of the silylation agent into the processing chamber. The process conditions may be the same as or similar to the process conditions previously described herein for the introduction of vinyl silane containing compounds and silylation agents. At block 540, the porous low-k dielectric layer is optionally exposed to an ultraviolet (UV) cure process to repair the low-k dielectric film 100. The UV cure process of block 540 may be performed prior to the process of block 530, simultaneously with the process of block 530, subsequent to the process of block 530, or any combinations of the aforementioned sequences. The process conditions for the UV cure process of block 540 may the same as or similar to the process conditions of the UV cure process of block 240.

Figure 6:
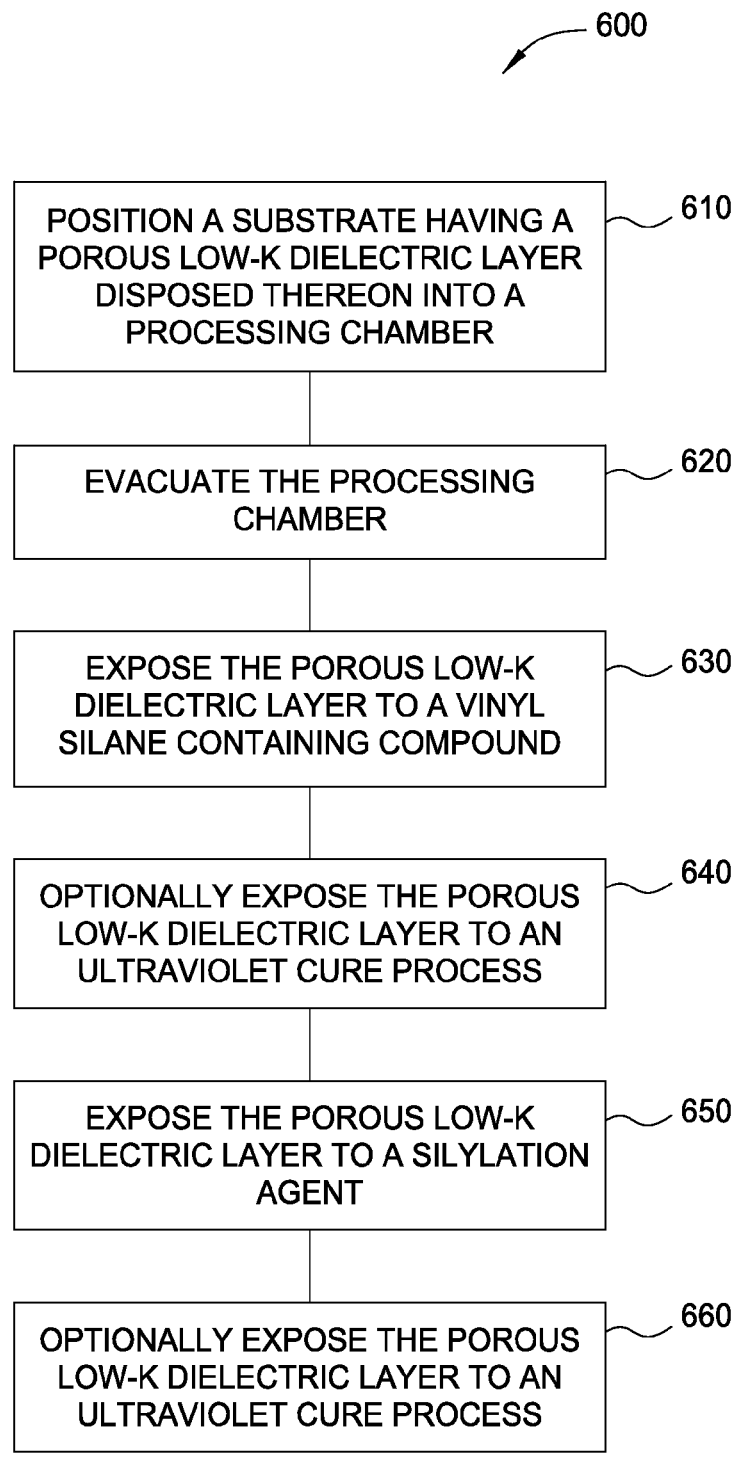
FIG. 6 is a process flow diagram illustrating another method of repairing a damaged film according to implementations described herein.

FIG. 6 is a process flow diagram illustrating another method 600 of repairing a damaged film according to implementations described herein. The method 600 is similar to the method 500 except that the porous low-k dielectric layer is exposed to the vinyl silane containing compound and the silylation agent sequentially. At block 610, a substrate having a porous low-k dielectric layer disposed thereon is positioned in a processing chamber. At block 620, the processing chamber may be evacuated.

At block 630, the porous low-k dielectric layer is exposed to a vinyl silane containing compound. The vinyl silane containing compound may be in liquid or vapor form. A carrier gas, such as He, Ar, $N_2$, and combinations thereof, may be used to assist the flow of the vinyl silane containing compound into the processing chamber. The process conditions may be the same as or similar to the process conditions previously described herein for the introduction of vinyl silane containing compounds into a processing chamber.

At block 640, the porous low-k dielectric layer is optionally exposed to an ultraviolet (UV) cure process to repair the low-k dielectric film 100. The UV cure process of block 640 may be performed prior to the process of block 630, simultaneously with the process of block 630, subsequent to the process of block 630, or any combinations of the aforementioned sequences. The process conditions for the UV cure process of block 640 may the same as or similar to the process conditions of the UV cure process of block 240.

At block 650, the porous low-k dielectric layer is exposed to a silylation agent. The silylation agent may be in liquid or vapor form. A carrier gas, such as He, Ar, $N_2$, and combinations thereof, may be used to assist the flow of the silylation agent into the processing chamber. The process conditions may be the same as or similar to the process conditions previously described herein for the introduction of silylation agents into a processing chamber.

At block 660, the porous low-k dielectric layer is optionally exposed to an ultraviolet (UV) cure process to repair the low-k dielectric film 100. The UV cure process of block 660 may be performed prior to the process of block 650, simultaneously with the process of block 650, subsequent to the process of block 650, or any combinations of the aforementioned sequences. The process conditions for the UV cure process of block 660 may the same as or similar to the process conditions of the UV cure process of block 240.

Various purge gas and evacuation processes as described above may be performed during method 600. For example, it may be advantageous flow a purge gas into the chamber and/or evacuate the chamber after exposing the porous low-k dielectric layer to the vinyl silane containing compound and prior to exposing the low-k dielectric layer to a silylation agent.

Figure 7:
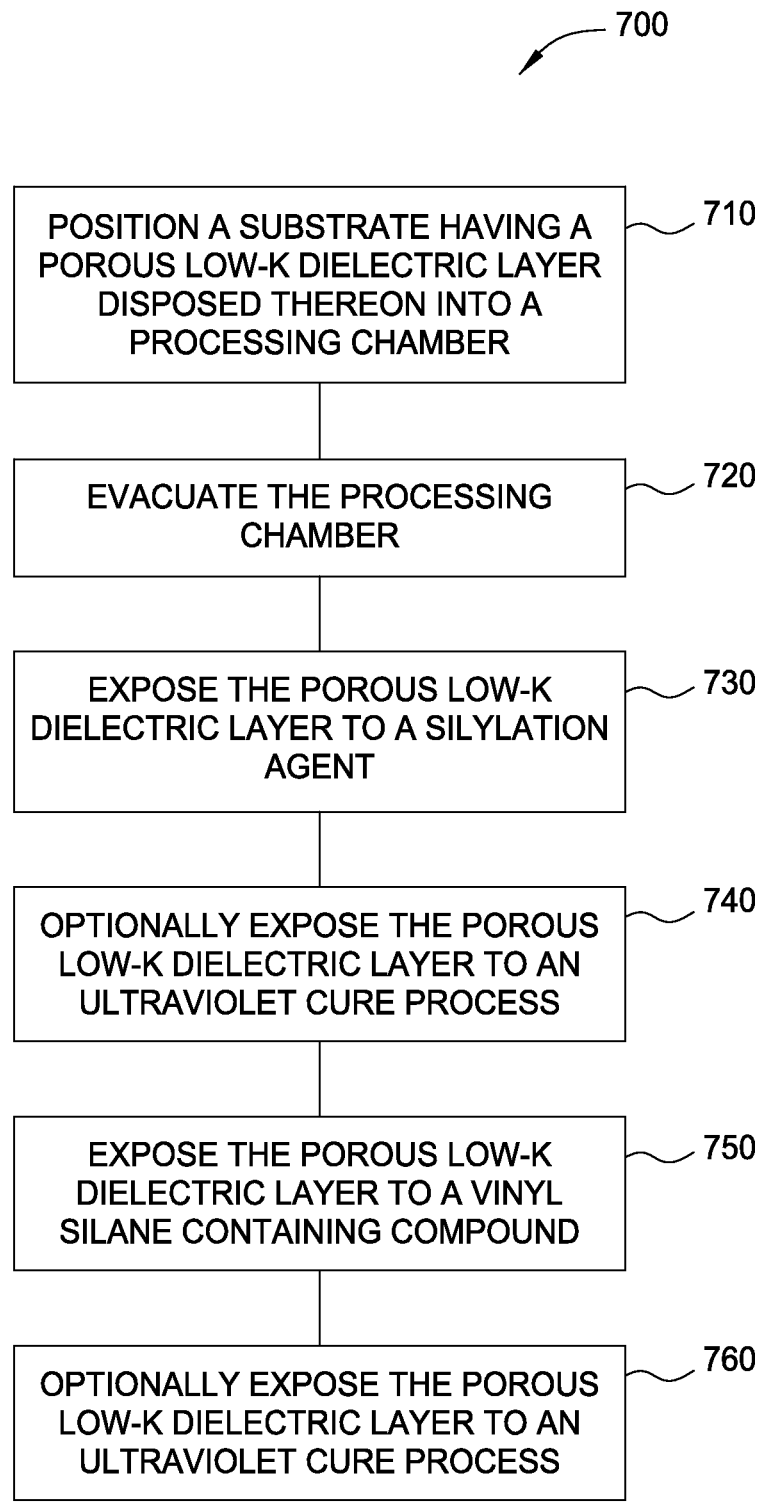
FIG. 7 is a process flow diagram illustrating another method of repairing a damaged film according to implementations described herein.

FIG. 7 is a process flow diagram illustrating another method 700 of repairing a damaged film according to implementations described herein. The method 700 is similar to the methods 500 and 600 except that the porous low-k dielectric layer is exposed to the silylation agent and the vinyl silane containing compound sequentially. At block 710, a substrate having a porous low-k dielectric layer disposed thereon is positioned in a processing chamber. At block 720, the processing chamber may be evacuated.

At block 730, the porous low-k dielectric layer is exposed to a silylation agent. The silylation agent may be in liquid or vapor form. A carrier gas, such as He, Ar, $N_2$, and combinations thereof, may be used to assist the flow of the silylation agent into the processing chamber. The process conditions may be the same as or similar to the process conditions previously described herein for the introduction of silylation agents into a processing chamber.

At block 740, the porous low-k dielectric layer is optionally exposed to an ultraviolet (UV) cure process to repair the low-k dielectric film 100. The UV cure process of block 740 may be performed prior to the process of block 730, simultaneously with the process of block 730, subsequent to the process of block 730, or any combinations of the aforementioned sequences. The process conditions for the UV cure process of block 740 may the same as or similar to the process conditions of the UV cure process of block 240.

At block 750, the porous low-k dielectric layer is exposed to a vinyl silane containing compound. The vinyl silane containing compound may be in liquid or vapor form. A carrier gas, such as He, Ar, $N_2$, and combinations thereof, may be used to assist the flow of the vinyl silane containing compound into the processing chamber. The process conditions may be the same as or similar to the process conditions previously described herein for the introduction of vinyl silane containing compounds into a processing chamber.

At block 760, the porous low-k dielectric layer is optionally exposed to an ultraviolet (UV) cure process to repair the low-k dielectric film 100. The UV cure process of block 760 may be performed prior to the process of block 750, simultaneously with the process of block 750, subsequent to the process of block 750, or any combinations of the aforementioned sequences. The process conditions for the UV cure process of block 760 may the same as or similar to the process conditions of the UV cure process of block 240.

Various purge gas and evacuation processes as described above may be performed during method 700. For example, it may be advantageous flow a purge gas into the chamber and/or evacuate the chamber after exposing the porous low-k dielectric layer to a silylation agent and prior to exposing the low-k dielectric layer to the vinyl silane containing compound.

Figure 8:
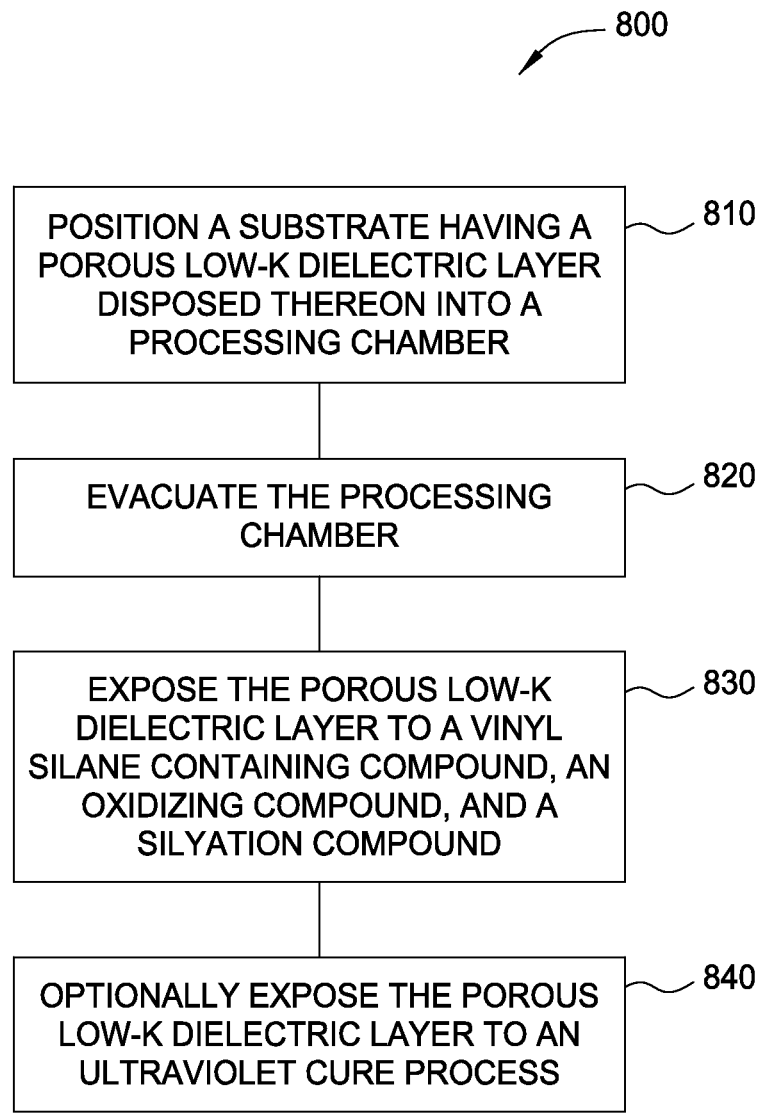
FIG. 8 is a process flow diagram illustrating another method of repairing a damaged film according to implementations described herein.

FIG. 8 is a process flow diagram illustrating another method 800 of repairing a damaged film according to implementations described herein. The method 800 is similar to the methods 200, 300, 400, and 500 except that the porous low-k dielectric layer is exposed to a vinyl containing compound, an oxidizing compound, and a silylation agent. Exposure to the vinyl silane containing compound, an oxidizing compound, and the silylation agent may occur simultaneously. Exposure to the vinyl silane containing compound, the oxidizing compound and the silylation agent may occur sequentially. In certain implementations where exposure is sequential, an optional purge process may be performed in between each exposure process. At block 810, a substrate having a porous low-k dielectric layer disposed thereon is positioned in a processing chamber. At block 820, the processing chamber may be evacuated. At block 830, the porous low-k dielectric layer is exposed to a vinyl silane containing compound, an oxidizing compound, and a silylation agent. The vinyl silane containing compound, oxidizing compound and silylation agent may each be in either liquid or vapor form. The vinyl silane containing compound, the oxidizing compound and silylation agent may be mixed prior to being supplied to the chamber or may enter the processing chamber separately and mix inside the processing chamber. A carrier gas, such as He, Ar, $N_2$, $H_2$, and combinations thereof, may be used to assist the flow of the various compounds into the processing chamber. The process conditions may be the same as or similar to the process conditions previously described herein for the introduction of vinyl silane containing compounds, oxidizing compounds and silylation agents. At block 840, the porous low-k dielectric layer is optionally exposed to an ultraviolet (UV) cure process to repair the low-k dielectric film 100. The UV cure process of block 840 may be performed prior to the process of block 830, simultaneously with the process of block 830, subsequent to the process of block 830, or any combinations of the aforementioned sequences. The process conditions for the UV cure process of block 840 may the same as or similar to the process conditions of the UV cure process of block 240.

After the dielectric film 100 has been repaired, subsequent processes may be performed to continue the fabrication of the semiconductor. For example, a diffusion barrier 106 may be deposited into the features 104 of the dielectric film 100 and a metal material 107, such as, for example, copper or a copper alloy, may be deposited into the features 104, as shown in FIG. 1D. It may be necessary to planarize the metal material 107 and remove any oxides from the metal material 107 that may form during planarization. Common metal oxide removal techniques involve the use of hydrogen or ammonia plasmas. The planarization and/or metal oxide removal processes may re-damage the surface of the dielectric film 100, as shown in FIG. 1E. The dielectric film 100 may be repaired using any of the repair processes described above, as shown in FIG. 1F.

The repair processes described effectively lower the k-value of the damaged dielectric films thus enabling the continued scaling of semiconductor device features.

The following table provides exemplary processing conditions and flow rates that are generally suitable for repairing and lowering the dielectric constant of low-k dielectric films used in semiconductor fabrication.

TABLE 1

| Parameter | Value | |
|---|---|---|
| Temperature (° C.) | 20-400° C. | 300-400° C. |
| Pressure (torr) | 50 mTorr-760 Torr | 1 Torr to 100 Torr |
| Vinyl Silane flow (sccm) | 1-10,000 sccm | 400-2,000 sccm |
| Oxidizer flow (sccm) | 1-10,000 sccm | 400-2,000 sccm |
| Silylation flow (sccm) | 1-10,000 sccm | 400-2,000 sccm |
| Carrier gas flow (sccm) | 1-10,000 | 400-2,000 sccm |
| | UV Cure Process | |
| Temperature (° C.) | 20-400° C. | |
| Pressure (torr) | 50 mTorr-760 Torr | 1 Torr to 100 Torr |
| Environment gas flow (sccm) | 8,000-24,000 | 16,000 |
| Treatment gas flow (sccm) | 2,000-20,000 | 12,000 |
| RF power (Watts) | 50 Watts-1,000 Watts | 500 Watts |

Figure 9:
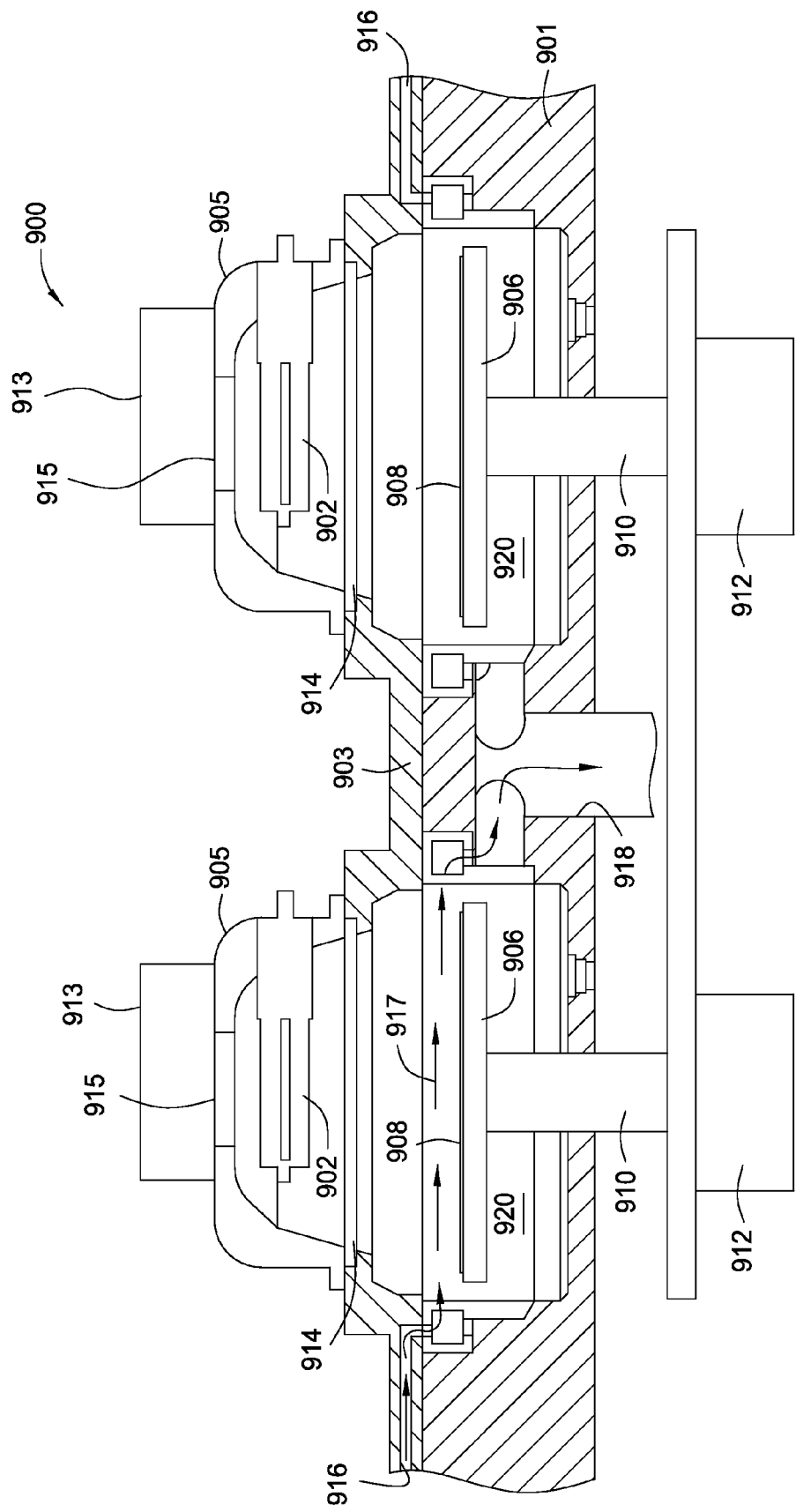
FIG. 9 is a cross-sectional view of an exemplary processing chamber that may be used to practice the implementations described herein.

FIG. 9 is a cross-sectional view of an exemplary processing chamber that may be used to practice the implementations described herein. FIG. 9 is based upon features of the PRODUCER® chambers currently manufactured by Applied Materials, Inc. The PRODUCER CVD chamber (200 mm or 300 mm) has two isolated processing regions that may be used to deposit carbon-doped silicon oxides and other materials.

FIG. 9 illustrates a tandem processing chamber 900 that is configured for UV curing. The tandem process chamber 900 includes a body 901 and a lid 903 that can be hinged to the body 901. Coupled to the lid 903 are two housings 905 that are each coupled to inlets along with outlets for passing cooling air through an interior of the housings 905. The cooling air can be at room temperature or approximately twenty-two degrees Celsius. A central pressurized air source (not shown) provides a sufficient flow rate of air to the inlets to insure proper operation of any UV lamp bulbs and/or power sources 913 for the bulbs associated with the tandem process chamber 900.

FIG. 9 shows a partial section view of the tandem process chamber 900 with the lid 903, the housings 905 and the power sources 913 that is configured for UV curing. Each of the housings 905 cover a respective one of two UV lamp bulbs 902 disposed respectively above two process regions 920 defined within the body 901. Each of the process regions 920 includes a heating pedestal 906 for supporting a substrate 908 within the process regions 920. The pedestals 906 can be made from ceramic or metal such as aluminum. Preferably, the pedestals 906 couple to stems 910 that extend through a bottom of the body 901 and are operated by drive systems 912 to move the pedestals 906 in the processing regions 920 toward and away from the UV lamp bulbs 902. The drive systems 912 can also rotate and/or translate the pedestals 906 during curing to further enhance uniformity of substrate illumination. Adjustable positioning of the pedestals 906 enables control of volatile cure by-product and purge and clean gas flow patterns and residence times in addition to potential fine tuning of incident UV irradiance levels on the substrate 908 depending on the nature of the light delivery system design considerations such as focal length.

In general, implementations of the invention contemplate any UV source such as mercury microwave arc lamps, pulsed xenon flash lamps or high-efficiency UV light emitting diode arrays. The UV lamp bulbs 902 are sealed plasma bulbs filled with one or more gases such as xenon (Xe) or mercury (Hg) for excitation by the power sources 913. Preferably, the power sources 913 are microwave generators that can include one or more magnetrons (not shown) and one or more transformers (not shown) to energize filaments of the magnetrons. In one implementation having kilowatt microwave (MW) power sources, each of the housings 905 includes an aperture 915 adjacent the power sources 913 to receive up to about 6,000 W of microwave power from the power sources 913 to subsequently generate up to about 100 W of UV light from each of the bulbs 902. In another implementation, the UV lamp bulbs 902 can include an electrode or filament therein such that the power sources 913 represent circuitry and/or current supplies, such as direct current (DC) or pulsed DC, to the electrode.

The power sources 913 for some implementations can include radio frequency (RF) energy sources that are capable of excitation of the gases within the UV lamp bulbs 902. The configuration of the RF excitation in the bulb can be capacitive or inductive. An inductively coupled plasma (ICP) bulb can be used to efficiently increase bulb brilliancy by generation of denser plasma than with the capacitively coupled discharge. In addition, the ICP lamp eliminates degradation in UV output due to electrode degradation resulting in a longer-life bulb for enhanced system productivity. Benefits of the power sources 913 being RF energy sources include an increase in efficiency.

Preferably, the bulbs 902 emit light across a broad band of wavelengths from 170 nm to 400 nm. The gases selected for use within the bulbs 902 can determine the wavelengths emitted. Since shorter wavelengths tend to generate ozone when oxygen is present, UV light emitted by the bulbs 902 can be tuned to predominantly generate broadband UV light above 200 nm to avoid ozone generation during cure processes.

UV light emitted from the UV lamp bulbs 902 enters the processing regions 920 by passing through windows 914 disposed in apertures in the lid 903. The windows 914 preferably are made of an OH free synthetic quartz glass and have sufficient thickness to maintain vacuum without cracking. Further, the windows 914 are preferably fused silica that transmits UV light down to approximately 150 nm. Since the lid 903 seals to the body 901 and the windows 914 are sealed to the lid 903, the processing regions 920 provide volumes capable of maintaining pressures from approximately 1 Torr to approximately 650 Torr. Processing or cleaning gases 917 enter the process regions 920 via a respective one of two inlet passages 916. The processing or cleaning gases 917 then exit the process regions 920 via a common outlet port 918. Additionally, the cooling air supplied to the interior of the housings 905 circulates past the bulbs 902, but is isolated from the process regions 920 by the windows 914.

EXAMPLES

Objects and advantages of the implementations described herein are further illustrated by the following hypothetic examples. The particular materials and amounts thereof, as well as other conditions and details, recited in these examples should not be used to limit the implementations described herein.

Example 1

Direct Si—H Reduction via Chemical Exposure: a substrate containing a damaged porous CDO film is first placed inside a chamber. The chamber is then evacuated with the use of a vacuum pump. Following evacuation, trimethylvinylsilane (TMVS, $CH_2$=CH—$SiMe_3$) is introduced into the chamber. The Si—H moiety reacts with TMVS to form Si—$CH_2$—$CH_2$—$SiMe_3$. An inert gas can be introduced at the same time. The process pressure can be at or lower than atmospheric pressure. The substrate temperature can be at room temperature or higher. Ultraviolet (UV) light exposure can be employed to assist/accelerate the reaction. The substrate is eventually removed from the chamber after exposure, possessing fewer Si—H bonds than it was before entering the chamber. Olefins, vinylsilanes, acetyl acetone, vinyl acetate, styrene, and acrylamide are known to react with Si—H, Chemicals in these families and derivatives thereof can be used in lieu of TMVS.

Example 2

Indirect Si—H Reduction via Oxidation and Silylation: A substrate containing a damaged porous CDO film is first placed inside a chamber. The chamber is then evacuated with the use of a vacuum pump. Following evacuation, oxygen, nitrous oxide, ozone, or a mixture thereof is introduced into the chamber to effect oxidation of Si—H to form Si—OH. An inert gas can be introduced at the same time. The process pressure can be at or lower than atmospheric pressure. The substrate temperature can be at room temperature or higher. Ultraviolet (UV) light exposure can be employed to assist/accelerate the reaction. After oxidation, the substrate possesses fewer Si—H bonds and more Si—OH bonds than it did before entering the chamber. Silylation, a second step, is to follow oxidation. In this step, CTMS is introduced into the chamber to react with Si—OH to form Si—O—$SiMe_3$. An inert gas can be introduced at the same time. The process pressure can be at or lower than atmospheric pressure. The substrate temperature can be at room temperature or higher. Ultraviolet (UV) light exposure can be employed to assist/accelerate the reaction. The substrate is eventually removed from the chamber. The overall result is reduction of Si—H bonding through oxidation and silylation. One or more silylating agents other than CTMS can be used instead of CTMS.

Example 3

Simultaneous Si—H and Si—OH Reduction—Technique I: Si—H and Si—OH can be reduced at the same time. A substrate containing a damaged porous CDO film is first placed inside a chamber. The chamber is then evacuated with the use of a vacuum pump. Following evacuation, a mixture of TMVS and CTMS, one possible combination as an example, is introduced into the chamber to reduce both Si—H and Si—OH simultaneously. An inert gas can be introduced at the same time. The process pressure can be at or lower than atmospheric pressure. The substrate temperature can be at room temperature or higher. Ultraviolet (UV) light exposure can be employed to assist/accelerate the reaction. The substrate is eventually removed from the chamber after exposure, possessing fewer Si—H bonds and fewer Si—OH bonds than it was before entering the chamber.

Example 4

Simultaneous Si—H and Si—OH Reduction—Technique II: Si—H and Si—OH can be reduced at the same time. A substrate containing a damaged porous CDO film is first placed inside a chamber. The chamber is then evacuated with the use of a vacuum pump. Following evacuation, a mixture of nitrous oxide and CTMS, one possible combination as an example, is introduced into the chamber to convert Si—H into Si—OH and reduce Si—OH simultaneously. An inert gas can be introduced at the same time. The process pressure can be at or lower than atmospheric pressure. The substrate temperature can be at room temperature or higher. Ultraviolet (UV) light exposure can be employed to assist/accelerate the reaction. The substrate is eventually removed from the chamber after exposure, possessing fewer Si—H bonds and fewer Si—OH bonds than it was before entering the chamber.

Example 5

Simultaneous Si—H and Si—OH Reduction—Technique Si—H and Si—OH can be reduced at the same time. A substrate containing a damaged porous CDO film is first placed inside a chamber. The chamber is then evacuated with the use of a vacuum pump. Following evacuation, a mixture of nitrous oxide, TMVS, and CTMS, one possible combination as an example, is introduced into the chamber to convert Si—H into Si—OH, reduce Si—H, and reduce Si—OH simultaneously. An inert gas can be introduced at the same time. The process pressure can be at or lower than atmospheric pressure. The substrate temperature can be at room temperature or higher. Ultraviolet (UV) light exposure can be employed to assist/accelerate the reaction. The substrate is eventually removed from the chamber after exposure, possessing fewer Si—H bonds and fewer Si—OH bonds than it was before entering the chamber.

Example 6

Multi-step Cascading Si—H and Si—OH Reduction: A. Direct Si—H reduction as described in as previously described herein (e.g., Example 1). B. Indirect Si—H reduction as previously described herein (e.g., Example 2). C. Si—OH reduction via silylation (with or without concurrent UV irradiation). D. Simultaneous Si—H and Si—OH reduction as previously described herein (e.g., Example 3). E. Simultaneous Si—H and Si—OH reduction as previously described herein (e.g., Example 4). F. Simultaneous Si—H and Si—OH reduction technique III as previously described herein (e.g., Example 5). G. UV irradiation only with or without inert gas(es) such as helium, nitrogen, and argon. The sequence of these steps can be of any order and each step can be used more than once between the time the substrate enters the chamber and the time the substrate exits the chamber. In any sequence, at the minimum one of the steps described previously in this invention (A, B, D, E, or F) is present. For example, one sequence can be: substrate in->C->G->A->G->substrate out. Another example can be: substrate in->C->A->G->substrate out.

While the foregoing is directed to implementations of the present invention, other and further implementations of the invention may be devised without departing from the basic scope thereof, and the scope thereof is determined by the claims that follow.

The invention claimed is:

1. A method of repairing a damaged low-k dielectric layer comprising;
    exposing a porous low-k dielectric layer to a vinyl silane containing compound; and
    exposing the porous low-k dielectric layer to an ultraviolet (UV) cure process.

2. The method of claim 1, wherein the exposing a porous low-k dielectric layer to a vinyl silane containing compound and exposing the porous low-k dielectric layer to a UV cure occur simultaneously.

3. The method of claim 1, wherein the vinyl-silane containing compound is of the following formula:

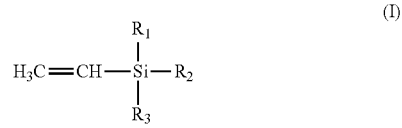

(I)

wherein $R_1$, $R_2$, and $R_3$ are each individually selected from hydrogen (H), alkyl groups, chlorine, vinyl groups, and alkoxy groups.

4. The method of claim 3, wherein the vinyl-silane containing compound is trimethylvinylsilane (TMVS).

5. The method of claim 3, wherein the vinyl-silane containing compound is in vapor phase.

6. The method of claim 1, further comprising positioning the porous low-k dielectric layer in a processing chamber prior to exposing a porous low-k dielectric layer to a vinyl silane containing compound.

7. The method of claim 6, wherein the processing chamber is at a pressure between 50 mTorr and 500 Torr, the dielectric layer is at a temperature between 100° C. and 400° C., the vinyl silane containing compound is flown into the processing chamber at a flow rate between 1 sccm and 10,000 sccm, the dielectric layer is contacted with UV radiation at a UV irradiance power between 100 W/m² and 2,000 W/m² and UV wavelengths between 100 nm and 400 nm.

8. The method of claim 1, further comprising:
    exposing the porous low-k dielectric layer to a silylation agent.

9. The method of claim 8, wherein the silylation agent is selected from a group consisting of: hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS) ($CH_3$—O—Si—$(CH_3)_3$), dimethyldimethoxysilane (DMDMS) (($CH_3)_2$—Si—$(OCH_3)_2$), methyltrimethoxysilane (MTMS) (($CH_3$—O$)_3$—Si—$CH_3$), phenyltrimethoxysilane (PTMOS) ($C_6H_5$—Si—$(OCH_3)_3$), phenyldimethylchlorosilane (PDMCS) ($C_6H_5$—Si(Cl)—$(CH_3)_2$), dimethylaminotrimethylsilane (DMATMS) (($CH_3)_2$—N—Si—$(CH_3)_3$), or bis(dimethylamino)dimethylsilane (BDMADMS).

10. The method of claim 8, further comprising:
    exposing the porous low-k dielectric layer to an oxidizing compound.

11. The method of claim 10, wherein the oxidizing compound is selected from a group consisting of: oxygen ($O_2$), oxygen-containing compounds, ozone ($O_3$), ozone-containing compounds, hydrogen peroxide ($H_2O_2$), peroxide containing compounds, and combinations thereof.

12. The method of claim 10, wherein exposing the porous low-k dielectric layer to a vinyl silane containing compound, exposing the porous low-k dielectric layer to a silyl containing compound, and exposing the porous low-k dielectric layer to an oxidizing compound occur simultaneously.

* * * * *

UNITED STATES PATENT AND TRADEMARK OFFICE
CERTIFICATE OF CORRECTION

PATENT NO. : 8,877,659 B2  
APPLICATION NO. : 13/903483  
DATED : November 4, 2014  
INVENTOR(S) : Chan et al.

Page 1 of 1

It is certified that error appears in the above-identified patent and that said Letters Patent is hereby corrected as shown below:

In the Specification

In Examples:

Column 14, Line 32, please insert --III:-- after Technique.

Signed and Sealed this
Nineteenth Day of April, 2016

Michelle K. Lee
*Director of the United States Patent and Trademark Office*